United States Patent
Kameshima et al.

(10) Patent No.: US 7,963,817 B2
(45) Date of Patent: Jun. 21, 2011

(54) PHOSPHOR-CONTAINING MOLDED MEMBER, METHOD OF MANUFACTURING THE SAME, AND LIGHT EMITTING DEVICE HAVING THE SAME

(75) Inventors: Masatoshi Kameshima, Anan (JP); Shoji Hosokawa, Tokushima (JP); Hiroto Tamaki, Anan (JP); Masatsugu Ichikawa, Tokushima (JP); Shoichi Yamada, Anan (JP); Daisuke Iwakura, Anan (JP)

(73) Assignee: Nichia Corporation, Anan-shi (JP)

( * ) Notice: Subject to any disclaimer, the term of this patent is extended or adjusted under 35 U.S.C. 154(b) by 290 days.

(21) Appl. No.: 12/233,009

(22) Filed: Sep. 18, 2008

(65) Prior Publication Data
US 2009/0072700 A1    Mar. 19, 2009

(30) Foreign Application Priority Data

Sep. 18, 2007   (JP) ................................ 2007-240346
Jul. 14, 2008   (JP) ................................ 2008-182459

(51) Int. Cl.
*H01J 9/24*   (2006.01)

(52) U.S. Cl. ......................................... 445/24; 313/512
(58) Field of Classification Search ....................... None
See application file for complete search history.

(56) References Cited

U.S. PATENT DOCUMENTS

| | | | |
|---|---|---|---|
| 2001/0001207 A1* | 5/2001 | Shimizu et al. | 257/98 |
| 2003/0129546 A1* | 7/2003 | Mitsui et al. | 430/320 |
| 2004/0012307 A1* | 1/2004 | Fukuda et al. | 310/328 |
| 2006/0175716 A1* | 8/2006 | Nakashima | 257/787 |

FOREIGN PATENT DOCUMENTS

| | | |
|---|---|---|
| JP | 2000-349340 A | 12/2000 |
| JP | 2000-349347 A | 12/2000 |
| JP | 2001-085747 A | 3/2001 |
| JP | 2003-258308 A | 9/2003 |
| JP | 2004-200531 A | 7/2004 |
| JP | 2006-202726 A | 8/2006 |
| WO | WO 2007039849 A1 * | 4/2007 |

\* cited by examiner

*Primary Examiner* — Nimeshkumar D Patel
*Assistant Examiner* — Donald L Raleigh
(74) *Attorney, Agent, or Firm* — Global IP Counselors, LLP

(57) ABSTRACT

In a method of manufacturing a phosphor-containing molded member, an inorganic powder in a mixture with a phosphor powder is melted by using Spark Plasma Sintering method, and then cooled. In a phosphor-containing molded member, a content of the phosphor therein is 5% by weight or more.

18 Claims, 4 Drawing Sheets

PHOSPHOR-CONTAINING MOLDED MEMBER, METHOD OF MANUFACTURING THE SAME, AND LIGHT EMITTING DEVICE HAVING THE SAME

BACKGROUND OF THE INVENTION

1. Field of the Invention

The present invention relates to a phosphor-containing molded member, a method of manufacturing the same, and a light emitting device having the phosphor-containing molded member.

2. Description of the Related Art

As a light emitting device using a fluorescent material or phosphor, there has been known a white light emitting device based on a combination of an LED chip emitting blue light and a YAG (yttrium aluminum oxide garnet) phosphor converting blue light to yellow light. The YAG phosphor is dispersed in an epoxy resin or silicone resin so as to be disposed around the LED chip. However, deterioration in the epoxy resin or silicone resin tends to occur with higher output power of an LED chip or generated heat from an LED chip. For this reason, there has been known a light emitting device using a glass having excellent thermal resistance and light resistance instead of epoxy resin or silicone resin, as described, for example, in JP2000-349340A, JP2000-349347A, JP2001-85747A, JP2004-200531, JP2003-258308A, and JP2006-202726A.

There has been known a conventional semiconductor light emitting device having a base substrate, a semiconductor light emitting element firmly fixed to the base substrate, and a coating material covering the semiconductor light emitting element, in which the coating material is polymetalloxane or ceramic having light transmissive property, as described, for example, in JP2000-349340A, JP2000-349347A, and JP2001-85747A. The coating materials described therein are glass mainly made of polymetalloxane bonding and contains a fluorescent material or phosphor. A coating material precursor solution is usually a liquid and forms a transparent coating material mainly made of a metalloxane bond of a metal oxide, due to decomposition of the components or absorbing of oxygen when heated in air or in an oxygen atmosphere. When a phosphor powder is mixed in such a coating precursor solution and the solution is applied around a semiconductor light emitting element, a coating material containing a phosphor which performs light conversion can be formed. The coating material precursor solution is typically injected in a recess of the base substrate and is calcined at a temperature in a range about 150° C. to 200° C. to solidify to form a coating material containing the phosphor so as to seal the semiconductor light emitting element. The calcination temperature of the coating material is sufficiently lower than the melting point of the semiconductor light emitting element. As described above, glass mainly formed with polymetalloxane bond has a low melting temperature so that the glass is in a liquid state at the time of sealing the semiconductor light emitting element. When the liquid glass solidifies, disconnection of the wire or detachment of the semiconductor light emitting element from the base substrate may occur due to the difference in expansion coefficient between each member.

There also has been known a conventional light emitting device in which an LED chip is mounted in a recess of a case made of ceramics, and a phosphor is applied around the LED chip by using a low melting point glass as a binder, as described, for example, in JP2004-200531A. The low melting point glass is applied around the LED chip and is melt by heat, then solidified. When the low melting point glass solidifies, disconnection of the wire or detachment of the LED chip from the case may occur due to the difference in expansion coefficient between each member. Moreover, the low-melting point glass has a poor light extraction efficiency. This is because the low-melting point glass has a color and a portion of the emitted light from the LED chip is absorbed by the colored portion of the low-melting point glass. Further, the low-melting point glass is susceptible to heat and humidity and has poor chemical stability.

There also has been known a conventional light emitting device having a blue light source and a emission color converting member, in which a part of blue light emitted from the blue light source is converted in yellow light which is combined with rest of the blue light to obtain white light, as described, for example, in JP2003-258308A. The emission color converting member is a glass having a softening point higher than 500° C., in which a $Y_3Al_5O_{12}$ based inorganic phosphor is dispersed. To obtain the emission color converting member, first, an inorganic phosphor powder and glass powder are mixed to obtain an emission color converting member material. A resin binder is added to the emission color converting member material and pressure forming is performed to form a disk-shaped preform. The preform is fired to remove the resin binder and to sinter the preform into the emission color converting member. The sintering temperature of this perform is in a range of 400° C. to 850° C. In an example, the density of an inorganic phosphor contained in the glass is in a range of 0.05% by volume to 10.0% by volume. This emission color converting member is made by sintering an inorganic phosphor powder and a glass powder while removing a resin binder. Therefore, the inorganic phosphor cannot be contained at a high concentration. Because, if the inorganic phosphor is contained at a high concentration, the emission color converting member becomes very brittle.

Further, there has been known a conventional light emitting device having an ultraviolet LED element and an emission color converting member, in which ultraviolet light emitted from the ultraviolet LED element is converted into visible light, as described in JP2006-202726A. The emission color converting member is made by preparing an oxide glass power and a phosphor power in a compounding ratio of 90 to 10 by weight, or 95 to 5 by weight, to which a small amount of resin binder is added and mixed, then, the mixture is press-molded in a metal mold to form a button-shaped perform. The preform is sintered at a temperature in a range of plus or minus 150° C. of the softening point of the oxide glass to obtain a disk-shaped emission color converting member. Fluidity of glass at a temperature lower than the softening point of the oxide glass minus 150° C. is low, so that a dense sintered compact is difficult to obtain. At a temperature higher than the softening point thereof plus 150° C., the phosphor melts into the glass which may resulting in such as a low emission and discoloration of the glass. In a case where the compounding ratio of the phosphor powder with respect to the oxide glass powder is high, the obtained sintered compact will be very brittle.

Thus, the emission color converting members employing phosphor powder and glass powder used in the conventional light emitting devices have problems as described above.

SUMMARY OF THE INVENTION

Accordingly, an object of the present invention is to provide a phosphor-containing molded member in which the compounding ratio of a phosphor with respect to a glass powder is high. Another object of the present invention is to provide an improved method of manufacturing the phosphor-containing molded member.

After performing various tests to solve the problems described above, the inventor has achieved the present invention.

The present invention relates to a method of manufacturing a phosphor-containing molded member, in which an inorganic powder in a mixture with a phosphor powder is melted by using Spark Plasma Sintering method, and then cooled. Accordingly, a phosphor-containing molded member can be manufactured in a significantly short time. Moreover, the phosphor powder and the inorganic powder can be firmly composited.

Spark Plasma Sintering (SPS) method is a material synthesis and processing technology, in which pulsed electric energy is directly applied to gaps between the particles of green compact, and a high energy of high temperature plasma (discharge plasma) generated instantly by spark discharge is effectively utilized in thermal diffusion, electric field diffusion or the like. This allows performing sintering or sinter bonding at a lower temperature range in a shorter time, from a low temperature through an ultra-high temperature region of 2000° C. or greater, with respect to a conventional sintering method.

In the Spark Plasma Sintering method, a pressure of 15 kN or higher is preferably applied to the mixture described above. Particularly, applying a pressure in a range of 30 kN to 3 MN is more preferable. With this arrangement, a dense molded member can be obtained in a short time.

In addition, it is preferable to perform an annealing treatment after the Spark Plasma Sintering is performed. With this arrangement, a phosphor-containing molded member having desired light diffusing property can be obtained.

The present invention relates to a phosphor-containing molded member, which is obtained by melting a mixture of a phosphor powder and an inorganic powder, and which includes the phosphor in a concentration of 5% or greater by weight. More preferably, a content of the phosphor is 10% or greater by weight. With this arrangement, a hard and thin phosphor-containing molded member can be provided.

The sintering density of the phosphor-containing molded member is preferably 90% or higher, and more preferably 95% or higher, than the true density thereof. With this arrangement, a phosphor-containing molded member which is harder and thinner and has high light extraction efficiency can be provided.

For the inorganic member, glass having glass transition point of 200° C. or greater can be used. A glass having glass transition point of 480° C. or less is preferable. With this arrangement, a light emitting device having excellent heat resistance can be provided. Also, a material having a relatively low glass transition point can be used.

The inorganic member preferably has any one of at least one phosphor composition among the above-described phosphor, a composition substantially the same crystal system as the phosphor, or the same crystal system as the phosphor. With this arrangement, deterioration in conversion efficiency of the phosphor due to melt diffusion or thermal diffusion between the phosphor and the inorganic member in the Spark Plasma Sintering step can be prevented. In addition, the interface between the phosphor and the inorganic member can be made substantially continuously in terms of composition and crystal structure, so that loss of light at the bonded interface between the phosphor and inorganic member can be reduced.

Further, difference in index of refraction between the inorganic member and the phosphor is preferably 1.0 or less. With this arrangement, light converted by the phosphor can be extracted outside effectively.

A phosphor having average particle diameter in a range from 10 nm to 100 μm can be used for the phosphor described above. A uniform mixture of nanosize phosphor particles and inorganic member can be obtained in the Spark Plasma Sintering method, so that uniform emission can be obtained. Moreover, the Spark Plasma Sintering method allows sintering while preventing further development of the phosphor particles. Accordingly, phosphor particles in small size can be sintered while maintaining its dispersion state, so that a phosphor-containing molded member excellent in light diffusion properties can be obtained. In a case employing a phosphor with its average particle size of 50 μm or greater, the light conversion efficiency and light extraction efficiency of the phosphor increases, so that a phosphor-containing molded member with high emission intensity can easily be obtained. However, if the average diameter of the phosphor is too large, uniformity with inorganic member is difficult to obtain, so that the average diameter of the phosphor is preferably 100 μm or less.

The present invention relates to a light emitting device which has a light emitting element and the phosphor-containing molded member manufactured by the method described above or the phosphor-containing molded member described above, which is disposed around the light emitting element. Accordingly, at least a part of light emitted from the light emitting element reaches the phosphor-containing molded member and the wavelength thereof is converted by the phosphor contained in the molded member containing a fluorescent member to emit light in different wavelength than that of the light emitting element. The light from the phosphor and light from the light emitting element penetrating the phosphor-containing molded member are mixed. Thus, a light emitting device capable of emitting a mixed light such as white light can be provided.

Since the present invention is constructed as described above, a method of manufacturing a phosphor-containing molded member in a very short time can be provided. Moreover, a strong and thin phosphor-containing molded member can be provided. Further, a light emitting device discharging mixed light such as white light can be provided.

DETAILED DESCRIPTION OF THE PREFERABLE EMBODIMENTS

Preferred embodiments and examples of a phosphor-containing molded member and a method of manufacturing the same, and a light emitting device according to the present invention will now be described in detail below. However, the scope of the present invention is not construed to be limited by the disclosed embodiments and examples.

Figure 1:
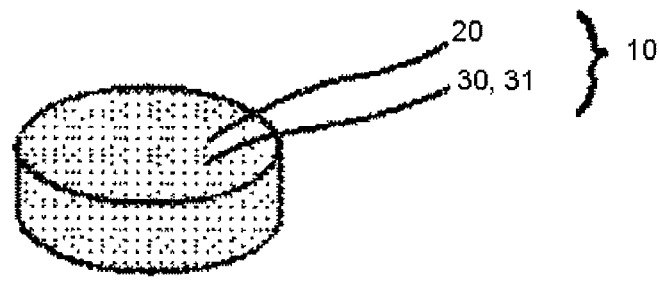
FIG. 1 is a schematic perspective view showing a phosphor-containing molded member according to an embodiment of the present invention.
Figure 2:
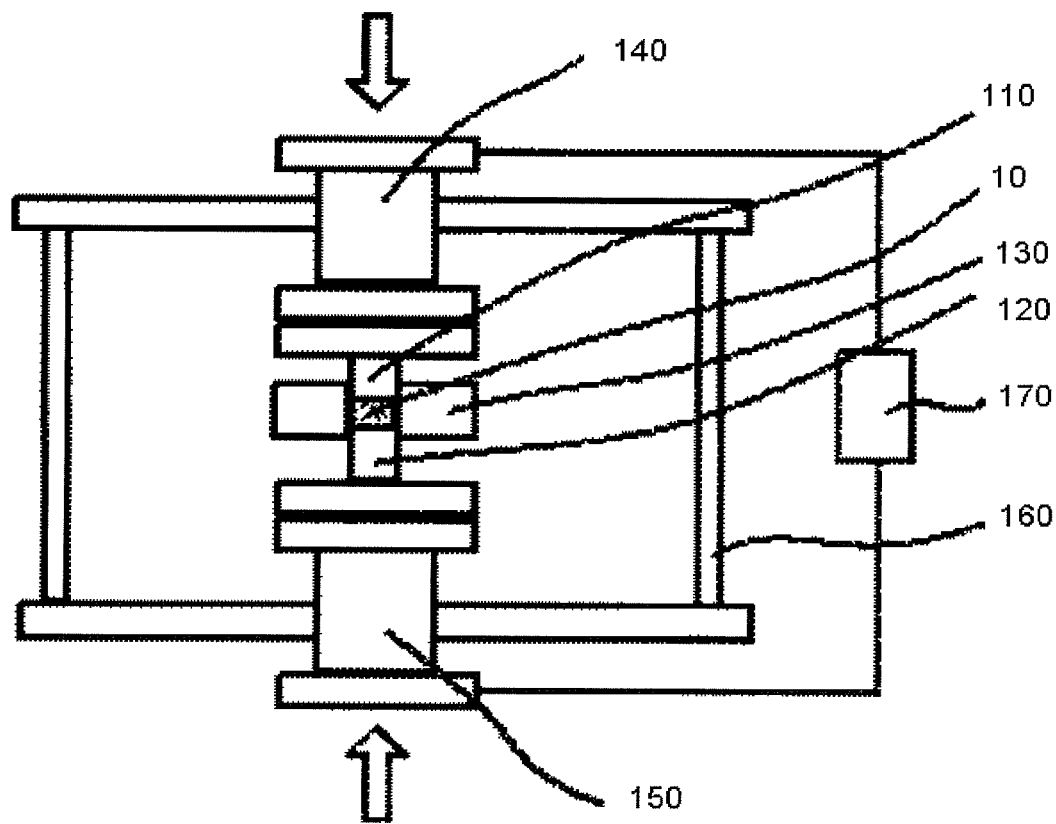
FIG. 2 is a schematic drawing showing a Spark Plasma Sintering apparatus according to the embodiment of the present invention.

FIG. 1 is a schematic perspective view showing a phosphor-containing molded member according to an embodiment of the present invention. FIG. 2 is a schematic drawing showing a Spark Plasma Sintering apparatus according to the embodiment of the present invention.

Phosphor-Containing Molded Member

A phosphor-containing molded member 10 according to the present embodiment is obtained by melting a mixture of powder of a fluorescent material also known as a phosphor 20 and an inorganic member powder 30 by using the Spark Plasma Sintering method and then cooling it. The shape of the phosphor-containing molded member 10 is not specifically limited, and a tabular shape, a disk shape, a rectangular solid shape or the like can be employed. The thickness of the phosphor-containing molded member 10 is not specifically limited, and a thickness which allows light emitted from a light emitting element transmitting therethrough may be employed. For example, the thickness of the phosphor-containing molded member 10 may be in a range of 0.5 mm to 5.0 mm. Also, the phosphor-containing molded member 10 may be of a thin type which contains the phosphor 20 at a high concentration, with which most of light emitted from the light emitting element is blocked but light from the phosphor-containing molded member 10 can be emitted with a high output. The size of the phosphor-containing molded member 10 is not specifically limited. The phosphor-containing molded member 10 can be used as it is obtained by using the Spark Plasma Sintering method, but in order to obtain a desired size, a side surface of the phosphor-containing molded member 10 may be cut by a cutting machine, or a scratch is made on a part of the phosphor-containing molded member 10 and a stress is applied along the scratch to divide it. Further, after this cutting or dividing, the side surface of the phosphor-containing molded member 10 may be polished. The phosphor-containing molded member 10 can be used without polishing its surface in some cases, but the surface thereof may also be polished to reduce the surface roughness. The content of the phosphor 20 in the phosphor-containing molded member 10 is preferably 10% by weight or higher, but the content of 5% by weight or higher can also be employed.

The phosphor powder 20, the inorganic member powder 30 or the like, which are row materials of the phosphor-containing molded member 10 will be described in detail below.

Phosphor and Phosphor Powder

The phosphor-containing molded member 10 contains a fluorescent material or phosphor (fluorescent material powder or phosphor powder) 20. In the present specification, the term "phosphor powder" refers to a state where it is used as a raw material before forming a composite of the phosphor-containing molded member, and the term "phosphor" refers to a state after it is formed into a composite as the phosphor-containing molded member. The phosphor 20 absorbs light emitted from a light emitting element and converts the wavelength of the light, and emits light having different wavelength than the light emitted from the light emitting element. The size of the phosphor powder 20 is not specifically limited and a size in a range from several nm to several tens of μm can be employed. In view of easiness of handling, the phosphor powder 20 having a particle size of about 3 μm to about 10 μm is preferable.

In the present specification, the term "particle size" refers to an average particle diameter called Fisher Sub Sieve Sizer number which is determined by using an air permeability method.

Examples of the phosphor powder 20 used as the raw material include the phosphors shown below. For example, the phosphor is preferably at least one selected from a nitride-based phosphor, an oxynitride-based phosphor, and a sialon-based phosphor, mainly activated by lanthanoids such as Eu and Ce; an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, a thiosilicate phosphor, an alkakine earth silicon nitride phosphor, and a germinate phosphor, mainly activated by lanthanoids such as Eu or by transition metal elements such as Mn; a rare earth aluminate phosphor and a rare earth silicate phosphor, mainly activated by lanthanoids such as Ce. For example, the phosphors shown below can be used but it is not limited thereto.

Examples of the nitride-based phosphor that is mainly activated by lanthanoid elements such as Eu and Ce include $M_2Si_5N_8$:Eu and MAlSiN$_3$:Eu (M represents at least one element selected from Sr, Ca, Ba, Mg and Zn). In addition to $M_2Si_6N_8$:Eu, the examples also include $MSi_7N_{10}$:Eu, $M_{1.8}Si_5O_{0.2}N_8$:Eu and $M_{0.9}Si_7O_{0.1}N_{10}$:Eu (M represents at least one element selected from Sr, Ca, Ba, Mg and Zn).

Examples of the oxynitride phosphor that is mainly activated by lanthanoid elements such as Eu and Ce include $MSi_2O_2N_2$:Eu (M represents at least one element selected from Sr, Ca, Ba, Mg and Zn).

Examples of the sialon-based phosphor that is mainly activated by lanthanoid elements such as Eu and Ce include $M_{p/2}Si_{12-p-q}Al_{p+q}O_qN_{16-p}$:Ce, and M-Al—Si—O—N (M represents at least one element selected from Sr, Ca, Ba, Mg and Zn, q is 0 to 2.5, and p is 1.5 to 3).

Examples of the alkaline earth halogen apatite phosphor that is mainly activated by lanthanoid elements such as Eu, or by transition metal elements such as Mn include $M_5(PO_4)_3X$:R (M represents at least one element selected from Sr, Ca, Ba, Mg and Zn. X represents at least one element selected from F, Cl, Br, and I, and R represents either Eu or Mn, or both).

Examples of the alkaline earth metal borate halogen phosphor include $M_2B_5O_9X$:R (M represents at least one element selected from Sr, Ca, Ba, Mg and Zn. X represents at least one element selected from F, Cl, Br, and I, and R represents either Eu or Mn, or both).

Examples of the alkaline earth metal aluminate phosphor include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R represents at least one selected from Eu and Mn, or both).

Examples of the alkaline earth metal silicate phosphor include $M_2SiO_4$:Eu (M represents at least one selected from Ca, Sr, Ba, Mg, and Zn).

Examples of the alkaline earth sulfide phosphor include $La_2O_2S$:Eu, $Y_2O_2S$:Eu and $Gd_2O_2S$:Eu.

Examples of the rare earth aluminate phosphor that is mainly activated by lanthanoid elements such as Ce include YAG based phosphor represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y,Gd)_3(Al, Ga)_5O_{12}$. The examples also include $Tb_3Al_5O_{12}$:Ce and $Lu_3Al_5O_{12}$:Ce in which portion or all of Y is substituted with Tb or Lu.

Examples of other phosphors include MS:Eu, $Zn_2GeO_4$:Mn and $MGa_2S_4$:Eu (M represents at least one element selected from Sr, Ca, Ba, Mg and Zn).

If necessary, the phosphors described above can contain at least one element selected from Tb, Cu, Ag, Au, Cr, Nd, Dy, Co, Ni and Ti, in place of Eu, or in addition to Eu.

It is possible to use a phosphor which is other than the phosphor described above and has the similar performances and effects as those of the phosphors.

With the exciting light from the light emitting element, each of the above described phosphors has an emission spectrum in yellow, red, green, and blue. Besides these phosphors, other phosphors each having an emission spectrum in neutral colors of yellow, blue-green, orange, and the like can be used. By using these phosphors in various combinations, light emitting devices with various emission colors can be provided.

For example, by using a GaN-based or InGaN-based compound semiconductor light emitting element that emits blue light, the phosphor such as $Y_3Al_5O_{12}$:Ce or $(Y_{0.8}Gd_{0.2})_3Al_5O_{12}$:Ce is irradiated to convert the wavelength. Light from the light emitting element and light from the phosphor are mixed, thus, the light emitting device capable of emitting white light can be provided.

For example, by using a phosphor comprising $CaSi_2O_2N$:Eu or $SrSi_2O_2N_2$:Eu which emits light in a range between green and yellow, $(Sr,Ca)_5(PO_4)_3Cl$:Eu which emits blue light, and $(Ca,Sr)_2Si_5N_8$:Eu which emits red light, the light emitting device capable of emitting white light with excellent color rendering properties can be provided. This is because the three primary colors of light, i.e., red, blue, and green are employed, a desired white color light can be produced.

Inorganic Member and Inorganic Member Powder

The phosphor-containing molded member 10 contains the inorganic member powder 30. In the present specification, the term "inorganic member powder" refers to a state where it is used as a raw material before forming a composite of a phosphor-containing molded member, and the term "inorganic member" refers to a state after it is formed into a composite as the phosphor-containing molded member. The inorganic member powder 30 is used to sustain the phosphor powder 20. The inorganic material powder is not specifically limited as long as it is capable of transmitting a part of light emitted from the light emitting element or a part of light discharged from the phosphor 20. Examples of the inorganic member powder 30 include glass and ceramics. Particularly, glass is preferable for the inorganic member powder 30 due to its relatively low softening point and inexpensive price.

For the inorganic member powder 30, a typical transparent dielectric inorganic material can be used. Examples of thereof include borosilicate glass, aluminum oxide, titanium oxide, niobium oxide, zirconium oxide, yttrium oxide, silicon oxide, and magnesium fluoride, and aluminum oxide is preferable in view of heat dissipation characteristics and light extraction efficiency. The inorganic member powder 30 preferably has any one of at least one phosphor composition among the phosphors 20 mixed therewith, a composition substantially the same crystal system as the phosphor, or the same crystal system as the phosphor. With this arrangement, deterioration in conversion efficiency of the phosphor due to melt diffusion or thermal diffusion between the phosphor and the inorganic member in the Spark Plasma Sintering step can be prevented. In addition, the interface between the phosphor and the inorganic member can be made substantially continuously in terms of composition and crystal structure, so that loss of light at the bonded interface between the phosphor and inorganic member can be reduced.

Glass

For the inorganic member powder 30, a glass powder 31 can be used. The glass powder 31 is needed to be able to transmit light from a light emitting element and to be able to sustain the phosphor 20, when the glass powder is formed into the phosphor-containing molded member 10. The size of the glass powder 31 is not specifically limited and the size in a range of several nm to several mm can be employed.

The glass powder 31 can be made of a lead-free glass preferably has a glass transition temperature in a range from 200° C. to 700° C. The melting point of the lead-free glass is preferably in a range from 220° C. to 800° C. In contrast, the glass powder 31 can be made of a lead glass which preferably has a glass transition temperature in a range from 300° C. to 700° C. The melting point of the lead glass is preferably in a range from 400° C. to 800° C. The glass powder 31 is melt by using the Spark Plasma Sintering method, so that the glass powder 31 having a relatively high glass transition temperature can be used. The glass powder 31 is heated to a temperature above its glass transition temperature but below its melting point to a softened state, so as to form the phosphor-containing molded member 10. Especially, the glass powder 31 preferably has a glass transition temperature of 430° C. to 600° C. This is provided that the softened state is not the liquified state which has been heated more than the melting point. This is because if the glass powder 31 is heated to above its melting point and liquefied, a crack tends to occur between the phosphor powder 20 and the glass powder 31 due to difference in coefficient of thermal expansion.

Examples of material of the glass powder 31 include $B_2O_2$—$SiO_2$, BaO—$B_2O_3$—$SiO_2$, ZnO—$B_2O_3$—$SiO_2$. The material of the glass 31 may include in addition to $SiO_2$ (silica), $B_2O_3$ (diboron trioxide), ZnO (zinc oxide), or $TiO_2$ (titanium oxide(IV)), an oxide such as PbO, $Ga_2O_3$, CdO, BaO, $Al_2O_3$, $La_2O_3$, $TaO_5$, $Li_2O$, $ZrO_2$, $WO_3$, $Nb_2O_5$, $P_2O_5$, $Na_2O$, $K_2O$, CaO, MgO, and MnO, and a fluoride such as LiF, NaF, KF, $AlF_3$, $MgF_2$, $CaF_2$, $SrF_2$, $BaF_2$, $YF_3$, $LaF_3$, $SnF_2$, and $ZnF_2$. With this arrangement, the melting point, the glass transition temperature, the refractive index, and the like can be adjusted to predetermined values. By adjusting the refractive index to a predetermined value, the light extraction efficiency of light emission from the light emitting element can be improved. It is also possible to increase the luster and to improve the transparency by incorporating Pb. In addition, inclusion of Pd facilitates removal of the phosphor-containing molded member 10 from the molding apparatus. It is preferable that the content of Pb in the glass powder 31 be 100 ppm or less, and it is especially preferable that substantially no Pb be included, in view of protection of the environment.

Other Components

A light diffusing member may be included in the phosphor-containing molded member 10, together with the phosphor powder 20 and an inorganic member powder 30. For the light diffusing member, barium titanate, titanium oxide, aluminum oxide, and silicon oxide, or the like is suitably used. The size of the light diffusing member is not specifically limited and the member having a median diameter in a range from 1 nm to 300 μm, preferably in a range from 1 nm to 100 μm can be used.

Spark Plasma Sintering Method

A spark plasma sintering apparatus 100 is used in the Spark Plasma Sintering method, in which, low voltage pulsing high current is applied to a powder mixture of the phosphor powder 20 and the inorganic member powder 30 to melt the inorganic member powder by a high energy discharge plasma which is momentarily generated by spark discharge. In the spark plasma sintering apparatus 100, the powder mixture is wedged by an upper punch 110 and a lower punch 120 which are respectively made of carbon and a sintering die 130. The sintering die 130 is cylindrical and the powder mixture is placed therein. At least one of the upper punch 110 and lower punch 120 is vertically movable in the cylindrical sintering die 130. The upper punch 110 and lower punch 120 are placed between an upper punch electrode 140 and lower punch electrode 150 respectively. The upper punch electrode 140 is connected with the upper punch 110 and the lower punch electrode 150 is connected with the lower punch 120. Pressure may be applied in the compressing direction of the powder mixture from the upper punch electrode 140 and lower punch electrode 150 through the upper punch 110 and lower punch 120 respectively. The powder mixture, upper punch 110 and lower punch 120, and sintering die 130 are arranged in a vacuum chamber 160. The upper punch electrode 140 and lower punch electrode 150 are electrically connected to a power source 170 respectively.

Method Of Manufacturing Phosphor-Containing Molded Member

The phosphor-containing molded member 10 may be formed by mixing the phosphor powder 20 and the inorganic member powder 30, melting the inorganic member powder in the mixture by using the Spark Plasma Sintering method, then cooling it. Herein, the inorganic member power 30 will be described, taking the glass powder 31 as an example.

(1) A mixture of the measured phosphor powder 20 and glass powder 31 is placed in the space compressed by the upper punch 110, the lower punch 120, and the sintering die 130.

(2) Using the upper punch electrode 140 and the lower punch electrode 150, a predetermined voltage is applied from the powder source 170 to supply a predetermined electric current. The upper punch 110 connected to the upper punch electrode 140 and the lower punch 120 connected to the lower punch electrode 150 generate heat. The electric current ins supplied in pulse with an interval of a micro second. Typically, the applied voltage is in the vicinity of 10 volts and current is several hundreds amperes or higher, which are suitably adjusted according to the amount and kind of the mixture. Application time is adjusted according to the amount and kind of the mixture and is typically quite short, typically in a range of 1 to 15 minutes. The rate of temperature increase may be adjusted according to the amount and kind of the mixture, for example, to a rate of 100 A/minute to 300 A/minute. While the current is supplied, pressure is applied to the upper punch 110 and lower punch in vertical directions. The voltage to be applied is adjusted suitably to 15 KN or higher, preferably to a range of 30 KN to 3 MN. This is corresponding to the pressure per unit area. The temperature in the vacuum chamber is preferably 2000° C. or less. A vacuum chamber is employed herein, but air, argon atmosphere, nitrogen atmosphere, or the like, may also be employed. As described above, the current is supplied by a pulse shape at an interval of micro second, and discharge plasma is generated at points of contact between particles of the mixture. High energy of high temperature plasma which is instantaneously generated by the discharge plasma is effectively applied to thermal diffusion, electric field diffusion, or the like. This enables "sintering" or "sinter bonding" to be carried out in a short time of 3 to 20 minutes, including temperature rising and retention from low temperature to ultrahigh temperature region of 2000° C. or higher. The method described above is termed "Spark Plasma Sintering method" herein.

(3) With the method described above, the phosphor-containing molded member 10 in which the inorganic member is melted is obtained.

In view of the light extracting efficiency and mechanical strength, the sintering density of the phosphor-containing molded member 10 with respect to the true density thereof is preferably 90% or more, more preferably 95% or more, and further preferably 98% or more.

However, unevenness in the color and luminance tend to occur in the phosphor-containing molded member 10 with a high sintering density. Therefore, in a case where the phosphor-containing molded member 10 is formed with a high sintering density, it is preferable to perform annealing treatment after the cooling step in the Spark Plasma Sintering method. Annealing treatment is performed under the temperature and atmosphere selected according to the kind of phosphor-containing molded member. The annealing is performed in an atmosphere of, for example, air, nitrogen, mixed gas of hydrogen and nitrogen, or the like. The annealing treatment may be performed immediately after the molded member is sintered or after applying a cutting process to the molded member. With this, light diffusing effect can be attained to the phosphor-containing molded member 10. It is considered the reason of increase in the light diffusing effect by the annealing treatment is that the activator in the vicinity of particle boundary of phosphor powder which has been deactivated in the sintering process is re-activated and the difference in refractive index with the inorganic member becomes significant. With the light emitting device incorporating the molded member containing thus formed phosphor-containing molded member 10, the dice-pattern of the light emitting elements is not casted on the irradiated area, so that uniform emission can be obtained.

In the present specification, the term "sintering density" is indicated by a rate (%) of the theoretical density calculated according to the compositions of the phosphor and inorganic member and the crystal system to the compact density measured by using principle of Archimedes. True density may be used instead of theoretical density. True density is measured by using, for example, ACCUPYC manufactured by Shimadzu Corporation. The mixture of the phosphor powder and the inorganic member powder prior to sintering and molding is placed in a predetermined container A and weighed. Then, He gas is filled in the container A to a given pressure, and the He gas is discharged into a container B of known volume. Lastly, the equilibrium pressure between the chamber A and the chamber B is measured, then, using the total volume and pressure change, the volume of the powder in the powder mixture can be determined. The true density can be calculated from the weight and the obtained powder volume. Archimedes method is used to obtain the density of the molded member, in which a pre-weighed phosphor-containing molded member is placed in a container filled with a liquid such as water and the weight of the molded member is divided by the volume of displaced water.

Light Emitting Device

The light emitting device at least includes a light source and the phosphor-containing molded member 10. The light source is not limited as long as the light source is capable of exciting the phosphor 20 contained in the phosphor-containing molded member 10, but a semiconductor light emitting element is preferred for its small size and long life. Light emitted from the light source is irradiated on the phosphor-containing molded member 10 and the phosphor-containing molded member 10 emits light having different wavelength than that of the light source. A part of the light from the light source and a part of the light from the phosphor-containing molded member 10 is mixed to generate a desired emission color. In addition, using a light source in ultraviolet region, a light emitting device having emission color of light emitted from the phosphor-containing molded member 10 can also be formed.

Light Emitting Element

A light emitting element which emits light in ultraviolet region or a light emitting element which emits light in blue-violet range, blue-range, blue-green range, green range, or the like, can be employed. The light emitting element preferably has an emission peak wavelength in a range of 360 to 550 nm. The light emitting element includes a light emitting diode element (LED) and a laser diode element (LD) or the like. A light emitting element emits light in blue range is preferably a group III nitride-based compound light emitting element. A light emitting element used herein has, for example, a stacked layer structure of an undoped n-type GaN layer, an n-type contact layer of n-type GaN doped with Si, an undoped GaN layer, a light emitting layer having a multiquantum well structure (quantum well structure of GaN barrier layer/InGaN well layer), a p-cladding layer of p-type GaN doped with Mg, and a p-type contact layer of p-type GaN doped with Mg stacked in sequence of a sapphire substrate via a GaN buffer layer.

Coating Film

A coating film may be disposed on the surface of the phosphor-containing molded member 10. With the coating film, the phosphor-containing molded member 10 can be prevented from becoming turbid. Turbidity of the phosphor-containing molded member 10 is attributable to crystallization of the glass. With the coating film, permeation of moisture can also be prevented. A coating film containing such as a light diffusing member and an ultraviolet absorbent maybe employed. For example, by using the coating film which absorbs light having a predetermined wavelength (light with wavelengths of 350 nm or less and 550 nm or more), the phosphor-containing molded member 10 capable of extracting light having a specific wavelength range (from 350 nm to 550 nm) can be provided. As for the coating film, not only a single-layer structure, but also a multi-layer structure can also be employed. With a multi-layer structure, the transmission factor can also be improved.

Package

The light emitting element and the phosphor-containing molded member 10 are disposed in a package. The light emitting element is disposed in the package and the phosphor-containing molded member 10 is disposed at a position where the light from the light emitting element is discharged outside directly or indirectly. The shape of the package is not specifically limited and a cup-shape, a planar-shape, an array-shape or the like can be employed. For example, using a cup-shaped package, a light emitting element may be disposed in the cup and the opening of the cup may be sealed with the phosphor-containing molded member 10. Also, using a package having a tabular pedestal and a cap defining an opening, a light emitting element may be disposed on the pedestal and the phosphor-containing molded member 10 may be disposed in the opening of the cap. Further, using an array defining a plurality of openings, a light emitting element may be disposed in each opening and the phosphor-containing molded member 10 may be disposed in each opening. A material such as a resin such as polyphthalamide or liquid crystal polymer, a glass epoxy substrate, ceramics or the like can be used for the package.

EXAMPLES

Examples 1 to 3

Figure 3:
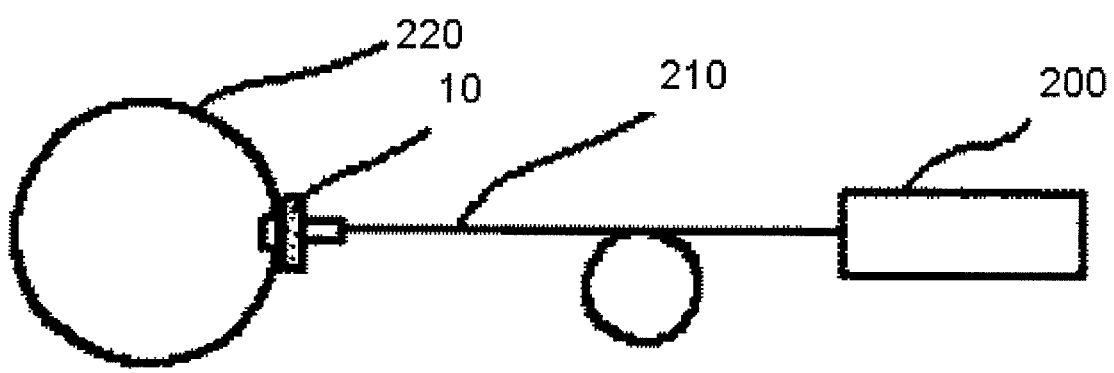
FIG. 3 is a schematic drawing showing a measuring method using an integrating sphere.
Figure 4:
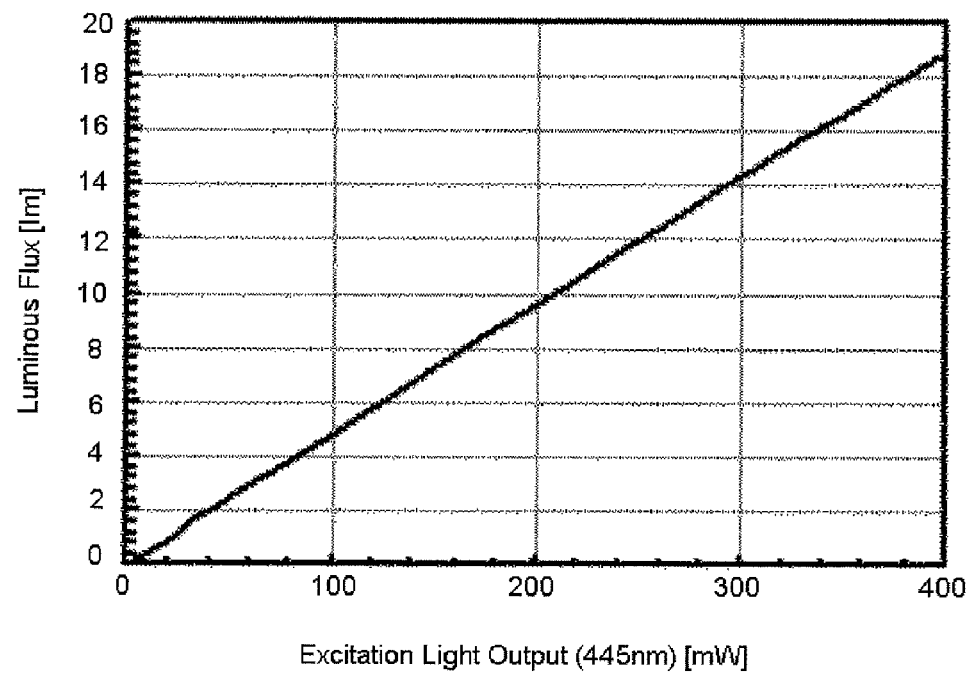
FIG. 4 is a graph showing measurement results of luminous flux and excitation light output of a phosphor-containing molded member according to Example 2 of the present invention.
Figure 5:
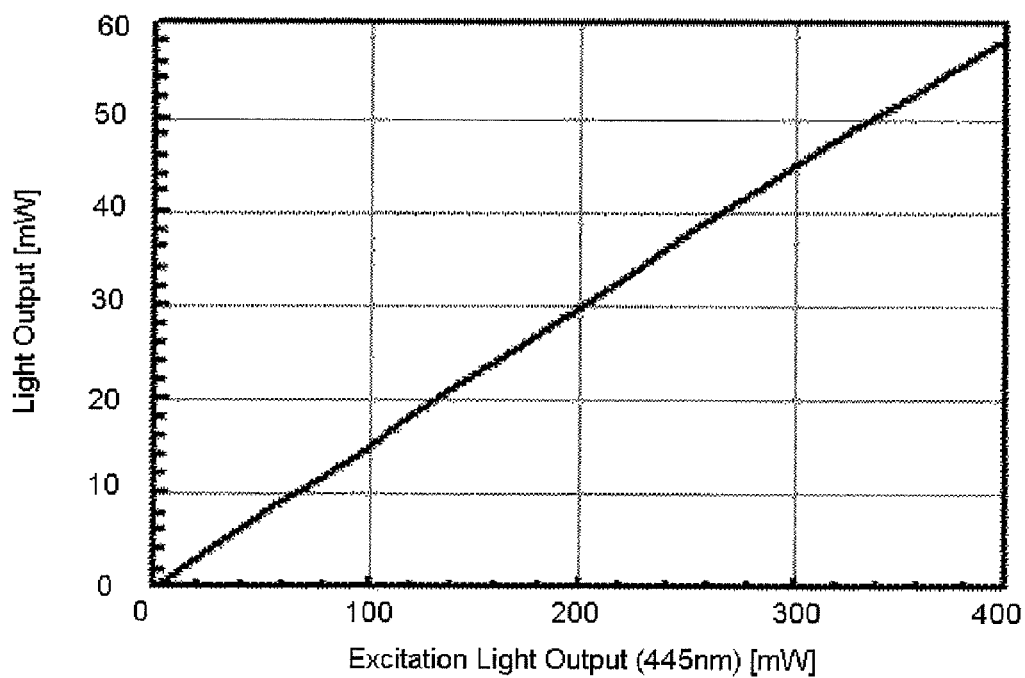
FIG. 5 is a graph showing measurement results of light output and excitation light output of a phosphor-containing molded member according to Example 2 of the present invention.
Figure 6:
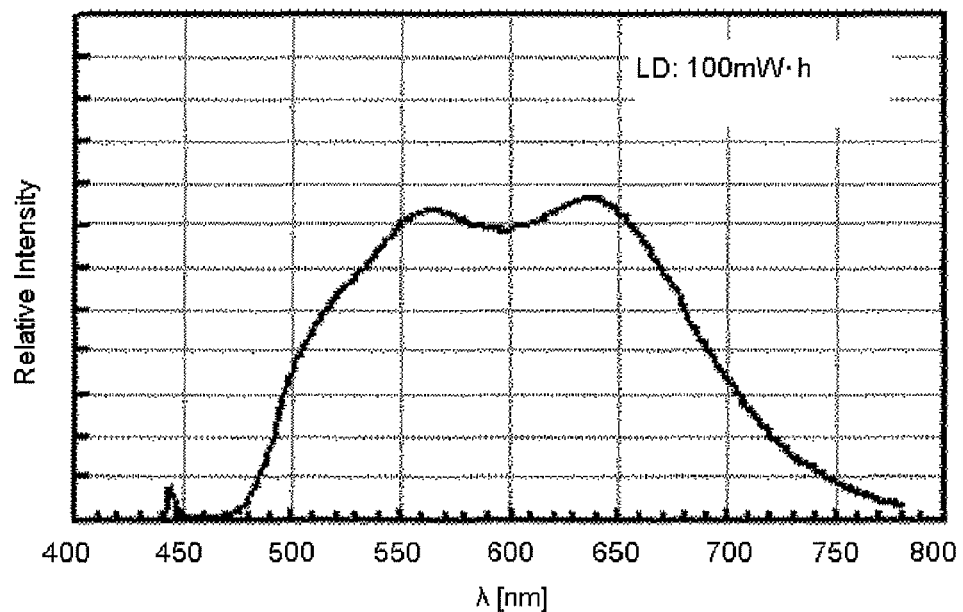
FIG. 6 is a graph showing an emission spectrum of a phosphor-containing molded member according to Example 2 of the present invention.
Figure 7:
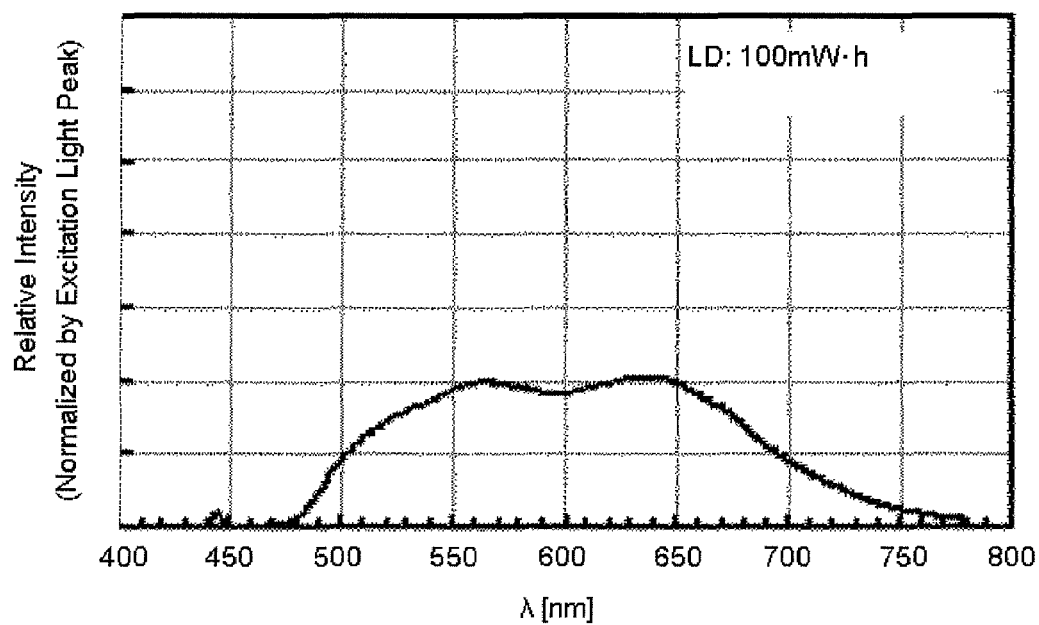
FIG. 7 is a graph showing an emission spectrum of a phosphor-containing molded member according to Example 2 of the present invention.

A phosphor-containing molded member according to Examples 1 to 3 will be described below. FIG. 1 is a schematic perspective view showing the phosphor-containing molded member according to the embodiment of the present invention. FIG. 3 is a schematic illustrated drawing showing a measuring method using an integrating sphere. FIG. 4 is a graph showing measurement results of luminous flux and excitation light output of a phosphor-containing molded member according to Example 2 of the present invention. FIG. 5 is a graph showing measurement results of luminous flux and excitation light output of the phosphor-containing molded member according to Example 2 of the present invention. FIG. 6 is a graph showing an emission spectrum of the phosphor-containing molded member according to Example 2 of the present invention. FIG. 7 is a graph showing an emission spectrum of the phosphor-containing molded member according to Example 2 of the present invention.

The phosphor-containing molded members 10 according to Examples 1 to 3 are manufactured respectively by way of the Spark Plasma Sintering method, using the phosphor powder 20 and glass powder 31 as raw materials.

Two kinds of phosphors, $Lu_3Al_5O_{12}$:Ce phosphor and $CaSiAlN_3$:Eu phosphor are used as the phosphor powder 20. The average diameter of $Lu_3Al_5O_{12}$:Ce phosphor and $CaSiAlN_3$:Eu phosphor is about 5 μm.

Borosilicate glass is used for the glass powder 31. Borosilicate glass has the glass transition point of 500° C., deformation point of 550° C., and specific gravity of 2.69 g/cc. The average diameter of borosilicate glass is about 120 μm.

Raw material mixing ratio (g) of the phosphor powder 20 using $Lu_3Al_5O_{12}$:Ce phosphor and $CaSiAlN_3$:Eu phosphor and the glass powder 31 using borosilicate glass is: ($Lu_3Al_5O_{12}$:Ce phosphor):($CaSiAlN_3$:Eu phosphor):(borosilicate glass)=14.88:0.62:84.500.

A spark plasma sintering machine 100 manufactured by SPS SYNTEX (Model No.: SPS-9.40MK-VII) is used. A sintering die 130 for forming a column-shaped phosphor-containing molded member 10 of about 34 mm in diameter is used. An upper punch 110, a lower punch 120, and a sintering die 130 used herein are made of graphite. The vacuum chamber is kept at about 10 Pa or less, and cooling water is supplied. To obtain a suitable rate of temperature rise, electric current of about 200 A/min is supplied. The punch pressure applied to the upper punch 110 and the lower punch 120 in vertical direction is about 28 KN.

In Example 1, 4.0 g of the above described mixed raw material including the phosphor powder 20 and the inorganic powder 31 is used. Electric current is applied for about 3 minutes at 520° C. which is higher than the glass transition temperature of borosilicate glass. As a result, obtained is the phosphor-containing molded member 10 of cylindrical shape with about 34 mm in diameter and 1.3 to 1.9 mm in length.

In Example 2, 4.0 g of the above described mixed raw material including the phosphor powder 20 and the inorganic powder 31 is used. Electric current is applied for about 5 minutes at 540° C. which is higher than the glass transition temperature of borosilicate glass. As a result, obtained is the phosphor-containing molded member 10 of cylindrical shape with about 34 mm in diameter and 1.5 to 1.7 mm in length.

In Example 3, 4.0 g of the above described mixed raw material including the phosphor powder 20 and the inorganic powder 31 is used. Electric current is applied for about 5 minutes at 530° C. which is higher than the glass transition temperature of borosilicate glass. As a result, obtained is the phosphor-containing molded member 10 of cylindrical shape with about 34 mm in diameter and 1.5 to 1.7 mm in length.

Measurement

The phosphor-containing molded member 10 formed in Example 2 is measured by using integrating sphere 220. The measuring system includes a laser element 200 capable of emitting a laser beam having an emission peak at 445 nm as a light source and an optical fiber 210 connected to the laser element 200, and the phosphor-containing molded member 10 is set at the tip of the optical fiber. Beam emitted from the laser element 200 propagates through the optical fiber 210 to irradiate the phosphor-containing molded member 10. Light discharged from the phosphor-containing molded member 10 is captured by the integrating sphere 220 and its luminous flux is measured.

As a result, the mixed light of the light from the laser element 200 and the light from the phosphor-containing molded member 10 exhibits white light. This white light includes yellow component to red component, so that it has good color rendering properties. Further, the phosphor-containing molded member 10 is chemically and thermally stable compared to conventional resins. Moreover, different than conventional hot pressing, the Spark Plasma Sintering method allows glass formation with a small thermal history. Therefore, molding is possible even with the phosphor powder 20 having weak thermal resistance.

Example 4

$Y_3(Al, Ga)_5O_{12}$:Ce phosphor is used for the phosphor powder 20. A phosphor-containing molded member is formed in a same manner as in Example 2, except that the raw material mixing ratio (g) of the phosphor powder 20 and the glass powder 31 using borosilicate glass is: ($Y_3(Al,Ga)_5O_{12}$:Ce):(borosilicate glass)=15.5:84.5. Yellow emission is observed when an LED having an emission peak wavelength of 455 nm is used to irradiate the phosphor-containing molded member.

Example 5

Three kinds of phosphors: $Sr_4Al_{14}O_{25}$:Eu phosphor, $Y_3(Al,Ga)_5O_{12}$:Ce phosphor, and $CaSiAlN_3$:Eu phosphor, are used for the phosphor powder 20. A phosphor-containing molded member is formed in a same manner as in Example 2, except that the raw material mixing ratio (g) of the phosphor powder 20 using $Sr_4Al_{14}O_{25}$:Eu phosphor, $Y_3(Al,Ga)_5O_{12}$:Ce phosphor, and $CaSiAlN_3$:Eu phosphor and the glass powder 31 using borosilicate glass is: ($Sr_4Al_{14}O_{25}$:Eu):($Y_3(Al,Ga)_5O_{12}$:Ce):($CaSiAlN_3$:Eu):(borosilicate glass)=5.5:9.3:9.38:0.62:84.5. Orange emission is observed when an LED having an emission peak wavelength of 455 nm is used to irradiate the phosphor-containing molded member.

Example 6

A phosphor-containing molded member is formed in a same manner as in Example 2, except that two kinds of phosphors: $BaMgAl_{10}O_{14}$:Eu phosphor and $Y_3(Al, Ga)_5O_{12}$:Ce phosphor are used and the raw material mixing ratio (g) of the phosphor powder 20 using $BaMgAl_{10}O_{14}$:Eu phosphor and $Y_3(Al,Ga)_5O_{12}$:Ce phosphor and the glass powder 31 using borosilicate glass is: ($BaMgAl_{10}O_{14}$:Eu):($Y_3(Al,Ga)_5O_{12}$:Ce):(borosilicate glass)=5.7:9.8:84.5. White emission is observed when an LED having an emission peak wavelength of 405 nm is used to irradiate the phosphor-containing molded member.

Examples 7 and 8

In Example 7, a mixed raw material which includes $(Y_{0.95}Gd_{0.05})_{2.85}Ce_{0.15}Al_5O_{12}$ phosphor powder having an average particle diameter of about 5.7 μm and aluminum oxide 31 having an average particle diameter of about 0.5 μm and the content of the phosphor powder therein is about 10% by weight is used. The same spark plasma sintering apparatus as described in Example 1 is used. The mixed raw material of about 38 g is charged into the sintering die 130, and the temperature is raised to about 1304° C. at a rate of temperature increase of about 50° C./min, and is kept at about 1304° C. for about 5 minutes. The punch pressure applied to the upper punch 110 and the lower punch 120 in vertical direction is about 46 KN. As a result, obtained is the phosphor-containing molded member 10 of cylindrical shape with about 34 mm in diameter and about 10 mm in length, with the sintered density being 97.7% relative to the true density.

In Example 8, the phosphor-containing molded member 10 is formed in a similar manner as in Example 7, except that a mixed raw material with the phosphor powder 20 content of about 20% by weight is used. As a result, obtained is the phosphor-containing molded member 10 of cylindrical shape with about 34 mm in diameter and about 10 mm in length, with the sintered density being 99.3% relative to the true density.

Example 9

In Example 9, a mixed raw material similar to that in Example 8 is used except that the phosphor powder 20 having an average particle diameter of 10.7 μm, obtained by mixing $(Y_{0.9}Gd_{0.1})_{2.85}Ce_{0.15}Al_5O_{12}$ phosphor powder and $Y_{2.8}Ce_{0.2}Al_5O_{12}$ phosphor powder at a weight ratio of about 8:1 is used. The same spark plasma sintering apparatus as described in Example 1 is used. The mixed raw material of about 38 g is charged into the sintering die 130, and the temperature is raised to about 1315° C. at a rate of temperature increase of about 47° C./min, and is kept at about 1304° C. The punch pressure applied to the upper punch 110 and the lower punch 120 in vertical direction is about 46 KN. As a result, obtained is the phosphor-containing molded member 10 of cylindrical shape with about 34 mm in diameter and about 10 mm in length, with the sintered density being 99.3% relative to the true density.

Examples 10 to 12

In Example 10, a mixed raw material is used in a similar manner as in example 8, except that the phosphor powder 20 of $Y_{2.935}Ce_{0.065}Al_5O_{12}$ phosphor powder having an average particle diameter of 4.4 µm is used. The same spark plasma sintering apparatus as described in Example 1 is used. The mixed raw material of about 35 g is charged into the sintering die 130, and the temperature is raised to about 1300° C. at a rate of temperature increase of about 43° C./min. The punch pressure applied to the upper punch 110 and the lower punch 120 in vertical direction is about 46 KN. As a result, obtained is the phosphor-containing molded member 10 of cylindrical shape with about 34 mm in diameter and about 10 mm in length, with the sintered density being 98.5% relative to the true density.

In Example 11, a phosphor-containing molded member is formed in a similar manner as in Example 10, except that the content of the phosphor powder 20 is 40% by weight. As a result, obtained is a phosphor-containing molded member 10 of cylindrical shape with about 34 mm in diameter and about 10 mm in length, with the sintered density being 98.6% relative to the true density.

In Example 12, a phosphor-containing molded member is formed in a similar manner as in Example 10, except that the content of the phosphor powder 20 is 60% by weight. As a result, obtained is the phosphor-containing molded member 10 of cylindrical shape with about 34 mm in diameter and about 10 mm in length, with the sintered density being 99.4% relative to the true density.

Example 13

A mixed raw material similar to that in Example 8 is used, except that $Y_2O_3$ powder 20 having an average particle diameter of 1.1 µm is used as the inorganic member powder 31. The same spark plasma sintering apparatus as described in Example 1 is used. The mixed raw material of about 46 g is charged into the sintering die 130, and the temperature is raised to about 1300° C. at a rate of temperature increase of about 38° C./min. The punch pressure applied to the upper punch 110 and the lower punch 120 in vertical direction is about 46 KN. As a result, obtained is the phosphor-containing molded member 10 of cylindrical shape with about 34 mm in diameter and about 10 mm in length, with the sintered density is 96.8% relative to the true density.

Example 14

A mixed raw material similar to that in Example 8 is used, except that $MgF_2$ powder 20 having an average particle diameter of 2.0 µm is used as the inorganic member powder 31. The same spark plasma sintering apparatus as described in Example 1 is used. The mixed raw material of about 32.1 g is charged into the sintering die 130, and the temperature is raised to about 900° C. at a rate of temperature increase of about 50° C./min. The punch pressure applied to the upper punch 110 and the lower punch 120 in vertical direction is about 46 KN. As a result, obtained is the phosphor-containing molded member 10 of cylindrical shape with about 34 mm in diameter and about 10 mm in length, with the sintered density being 97.2% relative to the true density.

Example 15

A mixed raw material similar to that in Example 10 is used, except that $Y_3Al_5O_{12}$ powder 20 having an average particle diameter of 4.3 µm is used as the inorganic member powder 31. The same spark plasma sintering apparatus as described in Example 1 is used. The mixed raw material of about 44 g is charged into the sintering die 130, and the temperature is raised to about 1300° C. at a rate of temperature increase of about 40° C./min. The punch pressure applied to the upper punch 110 and the lower punch 120 in vertical direction is about 46 KN. As a result, obtained is the phosphor-containing molded member 10 of cylindrical shape with about 34 mm in diameter and about 10 mm in length, with the sintered density being 98.1% relative to the true density.

Measurement

The molded members 10 obtained in Examples 7 to 15 are measured with a spectrophotofluorometer (Hitachi, F-4500). In the measuring system, a Xe lamp is used as a light source and the phosphor-containing molded member is arranged so that light emitted from the Xe lamp irradiates on the phosphor-containing molded member and light discharged from the phosphor-containing molded member enters a photomultiplier (Hamamatsu Photonics, R928). Light emitted from the Xe lamp is separated into 460 nm by propagating through the excitation side of the spectrometer and is irradiated on the phosphor-containing molded member. Light discharged from the phosphor-containing molded member enters the photomultiplier and its luminance is measured. The measured luminance is expressed as a relative value with respect to the luminance of the phosphor powder that is used. Accordingly, the luminances of the phosphor-containing molded members obtained in Examples 7 to 15 are, respectively, 73.3%, 74.4%, 72.0%, 98.4%, 77.3%, 74.0%, 72.2%, 80.0%, and 71.3%.

Examples 16 to 22

In Examples 7 to 15, annealing is performed respectively after sintering, in air at 1400° C. for 2 hours. As a result, obtained is a phosphor-containing molded member which is capable of emitting light of bright color with excellent diffusion properties. While annealing in air is described hereinabove, annealing can also be performed in a reduction atmosphere such as $N_2$ atmosphere and $H_2/N_2$ atmosphere.

Examples 23 to 29

Light emitting devices are formed, in each of which a phosphor-containing molded member respectively obtained in Examples 7 to 13 is disposed around a light emitting diode which emits light having a peak emission wavelength of 460 nm. Accordingly, the chromaticity coordinates of the devices are, respectively, (x/y)=(0.4543/0.5296), (x/y)=(0.4798/0.5093), (x/y)=(0.4568/0.5290), (x/y)=(0.4447/0.5381), (x/y)=(0.4488/0.5358), (x/y)=(0.4513/0.5335), (x/y)=(0.4557/0.5274), (x/y)=(0.4653/0.5199), and (x/y)=(0.4441/0.5382). The emission colors obtained in Examples 7 to 15 are in yellow regions, but white light can also be obtained by adjusting the thickness of the molded member, selection of inorganic member of a light transmissive dielectric material, and/or the compounding ratio of phosphor and inorganic member.

The method of manufacturing a phosphor-containing molded member according to the present invention can be used for fixing phosphor powder by dispersing phosphor powder in an inorganic member powder such as glass powder. The phosphor-containing molded member is excellent in thermal resistance and light resistance, so that it can be used in a light emitting device using a high output light source. The light emitting device can be used for a vehicle installation such as a headlight, for an illumination, for a backlight, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application claims priority to Japanese Patent Application No. 2007-240346 filed in Japan on Sep. 18, 2007. The entire disclosure of Japanese Patent Application No. 2007-240346 is incorporated hereinto by reference.

What is claimed is:

1. A method of manufacturing a phosphor-containing molded member comprising:
   preparing a mixture of a phosphor powder and a glass powder;
   heating the glass powder in the mixture by using Spark Plasma Sintering method in a temperature range that is above a glass transition temperature of the glass powder and below a melting point of the glass powder; and
   cooling the mixture.

2. The method of manufacturing phosphor-containing molded member according to claim 1, wherein
   in the Spark Plasma Sintering method, a pressure of 15 kN and higher is applied to the mixture.

3. The method of manufacturing phosphor-containing molded member according to claim 1, further comprising
   performing an annealing treatment to the mixture after the glass powder is heated by the Spark Plasma Sintering method.

4. A phosphor-containing molded member comprising:
   a mixture of a powder of a phosphor and a powder of an inorganic member, the powder of the inorganic member being melted and the inorganic member being selected from the group consisting of glass, titanium oxide, niobium oxide, zirconium oxide, yttrium oxide, silicon oxide, and magnesium fluoride,
   a content of the phosphor in the phosphor-containing molded member being 5% by weight or more,
   sintered density of the phosphor-containing molded member being 90% or higher relative to true density of the phosphor-containing molded member.

5. The phosphor-containing molded member according to claim 4, wherein
   the inorganic member is a glass having a glass transition temperature of 200° C. or higher.

6. The phosphor-containing molded member according to claim 4, wherein
   the inorganic member has one of a phosphor composition of the phosphor, a composition substantially the same crystal system as the phosphor, and the same crystal system as the phosphor.

7. The phosphor-containing molded member according to claim 6, wherein
   a difference in refractive index between the inorganic member and the phosphor is 1.0 or less.

8. The phosphor-containing molded member according to claim 4, wherein
   the phosphor powder has an average particle diameter in a range of 10 nm to 100 μm.

9. A light emitting device comprising:
   a light emitting element; and
   the phosphor-containing molded member formed by the method according to claim 1 and disposed around the light emitting element.

10. A light emitting device comprising:
    a light emitting element; and
    the phosphor-containing molded member according to claim 4 disposed around the light emitting element.

11. The method of manufacturing phosphor-containing molded member according to claim 1, wherein
    the glass powder has the glass transition temperature that is equal to or less than 700° C.

12. The method of manufacturing phosphor-containing molded member according to claim 11, wherein
    the glass powder has the glass transition temperature of 480° C. or less.

13. The method of manufacturing phosphor-containing molded member according to claim 1, wherein
    the glass powder has the glass transition temperature of 430° C. to 600° C.

14. A phosphor-containing molded member manufactured by using the method according to claim 1.

15. The phosphor-containing molded member according to claim 4, wherein
    the phosphor powder includes at least one phosphor selected from the group consisting of a nitride-based phosphor, an oxynitride-based phosphor, a sialon-based phosphor, an alkaline earth halogen apatite phosphor, an alkaline earth metal borate halogen phosphor, an alkaline earth metal aluminate phosphor, an alkaline earth metal silicate phosphor, an alkaline earth sulfide phosphor, and a rare earth aluminate phosphor.

16. The phosphor-containing molded member according to claim 4, wherein
    the inorganic member is borosilicate glass.

17. The phosphor-containing molded member according to claim 16, wherein
    the borosilicate glass is one of $B_2O_2$—$SiO_2$, $BaO$—$B_2O_3$—$SiO_2$ and $ZnO$—$B_2O_3$—$SiO_2$.

18. The phosphor-containing molded member according to claim 17, wherein
    the glass further contains at least one of $SiO_2$, $B_2O_3$, $ZnO$, $TiO_2$, $PbO$, $Ga_2O_3$, $CdO$, $BaO$, $Al_2O_3$, $La_2O_3$, $TaO_5$, $Li_2O$, $ZrO_2$, $WO_3$, $Nb_2O_5$, $P_2O_5$, $Na_2O$, $K_2O$, $CaO$, $MgO$, $MnO$, $LiF$, $NaF$, $KF$, $AlF_3$, $MgF_2$, $CaF_2$, $SrF_2$, $BaF_2$, $YF_3$, $LaF_3$, $SnF_2$, and $ZnF_2$.

* * * * *